United States Patent
Nii

(10) Patent No.: US 7,226,634 B2
(45) Date of Patent: Jun. 5, 2007

(54) DESIGNING A PLATED PATTERN IN PRINTED WRITING BOARD

(75) Inventor: Motoharu Nii, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/261,939

(22) Filed: Oct. 2, 2002

(65) Prior Publication Data

US 2003/0146101 A1    Aug. 7, 2003

(30) Foreign Application Priority Data

Feb. 1, 2002   (JP) .............................. 2002-025491

(51) Int. Cl.
B05D 3/00    (2006.01)
B05D 5/12    (2006.01)

(52) U.S. Cl. .............................. 427/9; 427/10; 427/96.1

(58) Field of Classification Search .................... 427/8, 427/9, 10, 96.1
See application file for complete search history.

(56) References Cited

U.S. PATENT DOCUMENTS 4,806,849  A  *  2/1989  Kihira et al. ............... 324/700
6,238,936  B1 *  5/2001  Yu ................................ 438/7
6,602,727  B1 *  8/2003  Rangarajan et al. .......... 438/14
6,643,839  B1 * 11/2003  Nishio et al. ................. 716/15
6,684,172  B1 *  1/2004  Subramanian et al. ...... 702/105

FOREIGN PATENT DOCUMENTS

| JP | 56-64493 | 6/1981 |
| JP | 1-321308 | 12/1989 |
| JP | 03-219370 | 9/1991 |
| JP | 04-350772 | 12/1992 |
| JP | 08-272076 | * 10/1996 |
| JP | 2001-123298 | 5/2001 |

OTHER PUBLICATIONS

Japanese Office Action for corresponding Japanese Application No. 2002-025491 dated Jun. 7, 2005.

* cited by examiner

Primary Examiner—Brian K. Talbot
(74) Attorney, Agent, or Firm—Staas & Halsey LLP

(57) ABSTRACT

The plating method comprises the steps of dividing a region, to be plated, into a group of mesh-like zones, measuring a plating area of each of the zones, comparing the measurement values of the plating areas and judging whether or not the plating area has any variance, and conducting a design change, on patterns contained in this zone, to eliminate the variance.

5 Claims, 9 Drawing Sheets

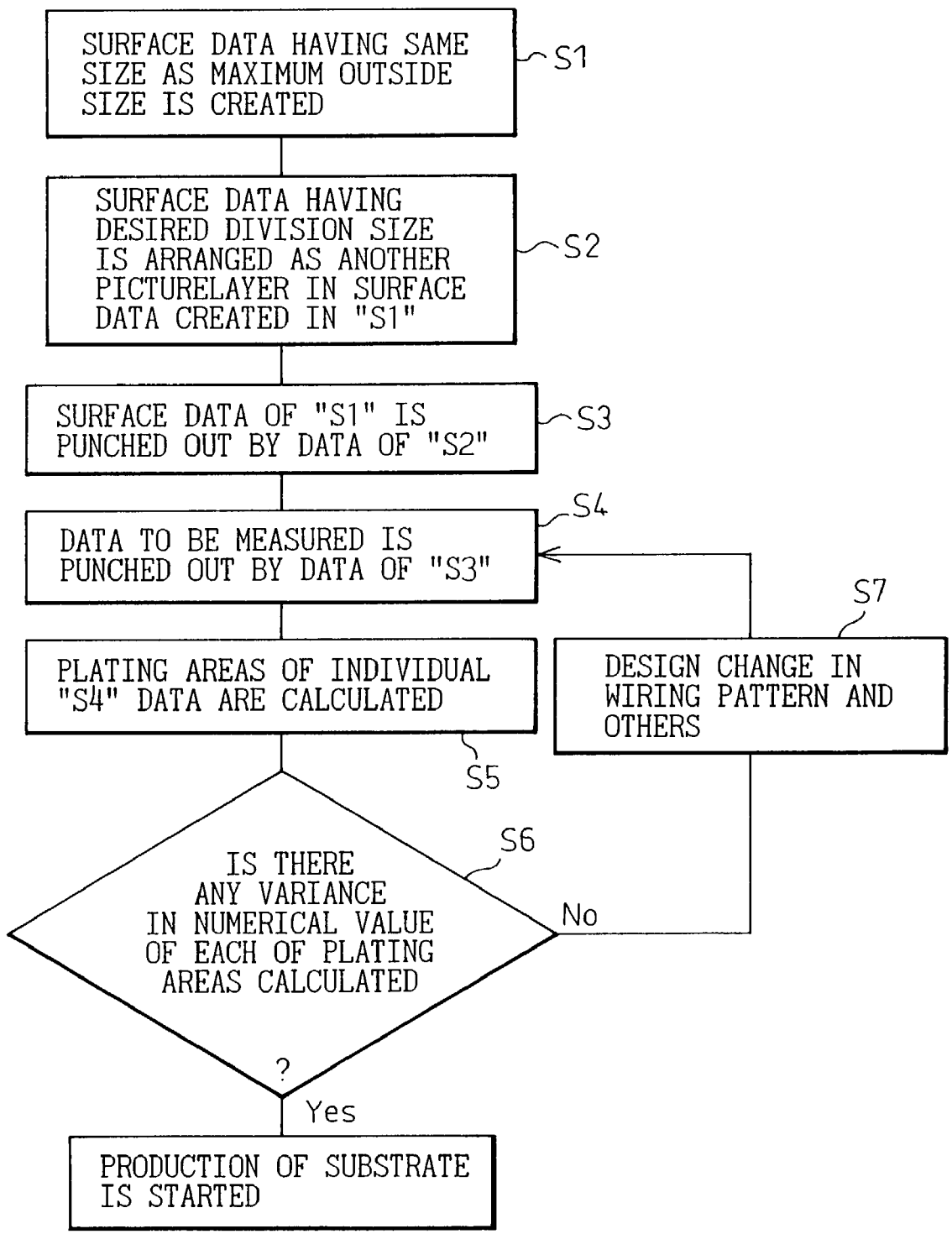

DESIGNING A PLATED PATTERN IN PRINTED WRITING BOARD

BACKGROUND OF THE INVENTION

1. Field of the Invention

This invention relates to a plating technology. More particularly, the invention relates to a method, and an apparatus, for controlling plating so as not to create variance in plating areas when a pattern-providing plating film is formed at a predetermined film thickness on a substrate, a control program and a recording medium that are used for such a control method and apparatus, and a plating method. As the invention can exactly control the plating area, based on such an exactly controlled plating area, the invention can appropriately assist a design change, such as feedback of design change to a designing department of patterns, and preconsideration of production conditions. Therefore, the invention can be used advantageously for producing printed wiring boards, in particular.

2. Description of the Related Art

Generally speaking, a printed wiring board is produced through a series of steps of boring holes in a substrate comprising a copper-clad laminate board, sequentially applying electroless copper plating and electrolytic copper plating to form a conductor layer having a predetermined thickness on the entire surface of the board, and selectively etching away unnecessary portions of the conductor layer to form wiring or the like in a desired pattern. Because remarkable progress has been made in recent years in the higher density of printed wiring boards and their multi-layered construction and a higher operational speed of devices mounted onto the boards, improvement in and management of plating steps have become very important. For example, it has been desired to provide a plating method capable of easily coping with production of a variety of kinds of products in limited quantities and with frequent design changes. If plating areas have any variance, the plating thickness becomes small or large, so that electrical characteristics are deteriorated and a waste of materials occurs. Therefore, strict management of the plating steps inclusive of the plating area has become necessary.

Japanese Unexamined Patent Publication (Kokai) No. 56-64493, for example, discloses a production method, for a printed board, which uses a photo-mask to correct a circuit pattern width to cope with variance in the thickness of electric copper plating in an etching step carried out after chemical copper plating and electric copper plating in order to minimize variance in the copper plating thickness. Japanese Unexamined Patent Publication (Kokai) No. 1-321308, now U.S. Pat. No. 2,593,690, discloses a plating area measurement apparatus for a printed wiring board characterized in that means, for calculating a pattern area from given pattern data and means for calculating an inner area of each through-hole from boring data and sheet thickness data, calculate a plating area of a printed wiring board so as to omit an expensive and troublesome step that uses a negative film for an optical measuring instrument, when the plating area is measured, to keep the plating thickness constant. Further, Japanese Unexamined Patent Publication (Kokai) No. 2001-123298 discloses an electrolytic plating method that determines in advance a relational formula between an electrode potential and a current density and determines, on the other hand, a current value and a potential value when a plating object is polarized in a plating bath, calculates a plating area of a plating object from the relational formula, the current value and the potential value and conducts plating to a predetermined thickness, so as to reduce a variance in a deposition film thickness of a plating metal.

As described above, attempts have already been made to measure and control variance of the plating area to solve the problem of variance of the thickness of the plating film formed on the substrate for forming the pattern in the production of the printed wiring board according to the prior art. However, the prior art plating methods have employed only a method that optically scans the whole surface of one of the surface of the substrate and measures the plating area of the substrate as a whole. Therefore, this method cannot measure and adjust variance of the plating areas between top and back surfaces of the substrate. Thus, this method cannot sufficiently satisfy the recent technical progresses and requirements described above for the following reasons. If the plating area is different between a certain plating region and another when a plating film is considered as a single surface (single body) of the substrate, variance occurs in the plating thickness (when an additive method is used) or in an etching amount (when a subtractive method is used). Further, problems of planarity and warping of the substrate occur. When an insulating film is formed on or below the plating film, control of the film thickness of the insulating film becomes difficult, and insulating defects and connection defects occur due to a flow of the insulating resin.

SUMMARY OF THE INVENTION

It is an object of the invention to provide a plating method that solves the problems of the prior art technologies described above, can easily cope with production of a variety of kinds of products in limited quantities and with frequent design changes, can moreover eliminate variance of plating areas and hence plating film thickness, and can solve the problems of planarity and warping of a substrate and the problems of film thickness control of an insulating film.

It is another object of the invention to provide a control method of a plating area useful in the practice of the plating method described above.

It is still another object of the invention to provide a control program for a plating area useful in the practice of the plating method described above.

It is still another object of the invention to provide a recording medium useful in the practice of the plating method described above.

It is still another object of the invention to provide a control apparatus of a plating area useful in the practice of the plating method described above.

These and other objects of the invention will be easily understood from the following detailed explanation of the invention.

According to one aspect of the invention, there is provided a control method for a plating area for preventing variance of plating areas when a pattern-providing plating film is formed at a predetermined thickness on a substrate, comprising the steps of:

dividing a region, to be plated, of the substrate into a group of mesh-like zones, each having substantially the same area;

measuring the plating area of each of the zones;

comparing the measurement values of the plating areas and judging whether or not variance exists in the plating area in each of the zones; and conducting a design change of patterns contained in any of the zones to eliminate the variance when the variance of the plating area is judged as existing in the variance judgment step.

According to another aspect of the invention, there is provided a program used in combination with a computer when a pattern-providing plating film is formed at a predetermined film thickness on a substrate, the program causing the computer to execute the steps of:

dividing a region, to be plated, of the substrate into a group of mesh-like zones each having substantially the same area;

measuring the plating area for each of the zones;

comparing the measurement values of the plating areas and judging whether or not the plating area has variance in each of the zones; and conducting a design change of the patterns contained in any of the zones to eliminate the variance when the plating area is judged as having a variance in any of the zones in the variance judgment step.

According to still another aspect of the invention, there is provided a computer-readable recording medium used in combination with a computer when a pattern-providing plating film is formed at a predetermined film thickness on a substrate, the recording medium storing a program for causing the computer to execute the steps of:

dividing a region, to be plated, of the substrate into a group of mesh-like zones each having substantially the same area;

measuring the plating area for each of the zones;

comparing the measurement values of the plating areas and judging whether or not the plating area has variance in each of the zones; and conducting a design change of the patterns contained in any of the zones to eliminate the variance when the plating area is judged as having the variance in any of the zones in the variance judgment step.

According to still another aspect of the invention, there is provided an apparatus for preventing variance of plating areas when a pattern-providing plating film is formed at a predetermined film thickness on a substrate, comprising:

a plating region-division unit for dividing a region, to be plated, of the substrate into a group of mesh-like zones each having substantially the same area;

an area measurement unit for measuring the plating area for each of the zones;

a variance judgment unit for comparing the measurement values of the plating areas and judging whether or not variance exists in the plating area of each of the zones; and a pattern design-changing unit for conducting a design change of patterns contained in any of the zones to eliminate the variance when the plating area is judged as having a variance in any of the zones by the variance judgment unit.

According to still another aspect of the invention, there is provided a plating method for forming a pattern-providing plating film at a predetermined film thickness on a substrate, comprising the steps of:

dividing a region, to be plated, of the substrate into a group of mesh-like zones each having substantially the same area;

measuring the plating area for each of the zones;

comparing the measurement values of the plating areas and judging whether or not the plating area has variance in each of the zones;

conducting a design change of the patterns contained in any of the zones to eliminate variance when the plating area is judged as having a variance in any of the zones in the variance judgment step; and subjecting the substrate to a plating step under the condition where the plating areas do not substantially have the variance in all of the zones.

BRIEF DESCRIPTION OF THE DRAWINGS

FIG. 2 is a flowchart showing an example of a plating area control method according to the invention;

DESCRIPTION OF THE PREFERRED EMBODIMENTS

Figure 1:
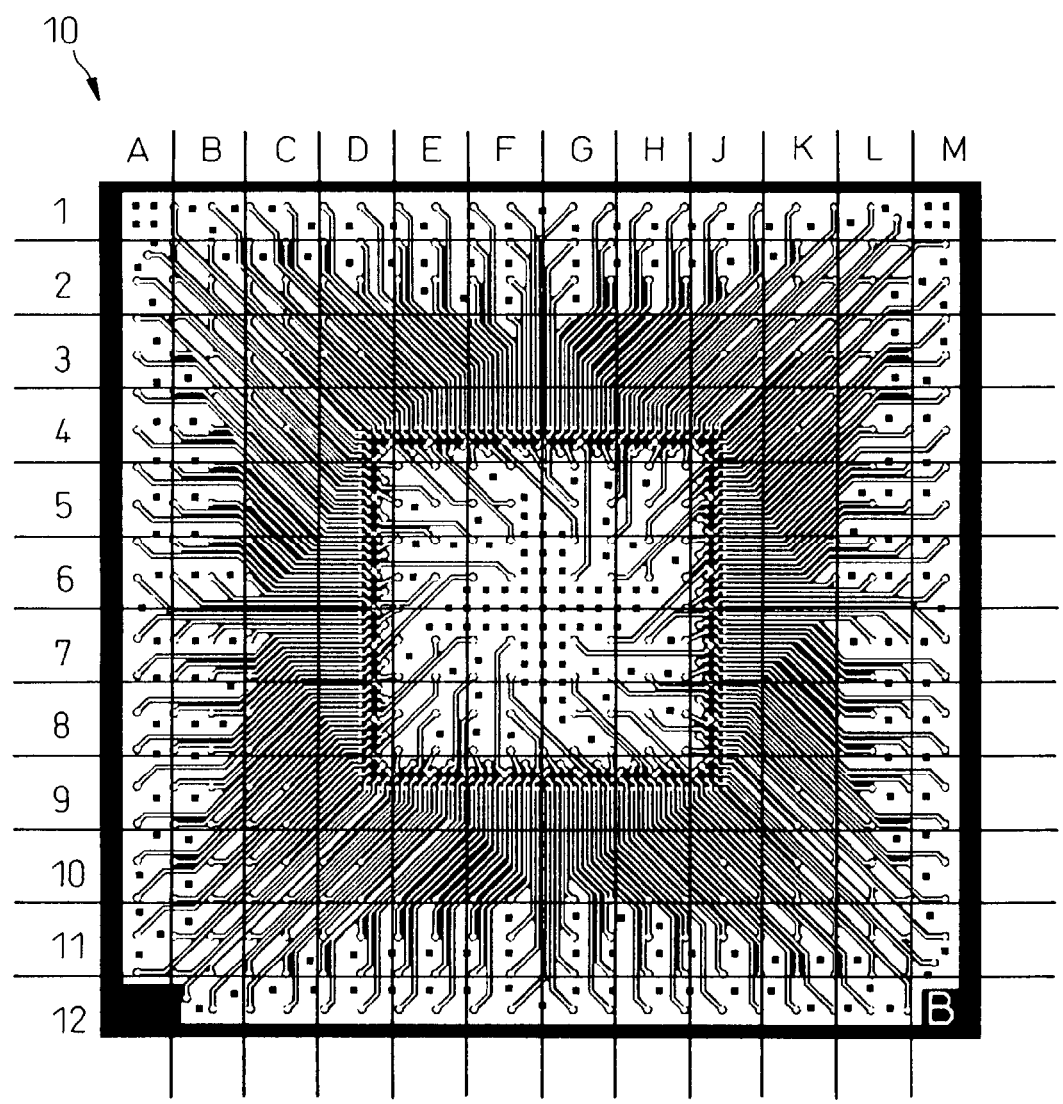
FIG. 1 is a plan view showing an example of a printed wiring board used in the practice the invention.

This invention relates to a plating method for forming a plating film, for use in pattern, to a predetermined film thickness on a substrate as an underlying base, a control method for a plating area useful for such a plating method, a control program for a plating area, a recording medium for controlling a plating area and a control apparatus for a plating area.

The plating method according to the invention and the control method of the plating area etc, used for the plating method, can be applied broadly and advantageously to plating steps, in general, used for producing semiconductor devices, printed wiring boards, and so forth, and its application range is not limited. Since the invention is particularly useful in the plating step used for producing the printed wiring boards, the present invention will be hereinafter explained in detail with reference to this plating step.

In the practice of the present invention, the plating method is carried out in accordance with an additive method or a subtractive method depending on a structure of a desired printed wiring board. These methods are generally carried out while a substrate, i.e., a plating object, as the underlying base is immersed in a plating solution having a predetermined composition. The plating solution can be broadly classified into an electrolytic plating solution and an electroless plating solution. These plating solutions are not particularly limited and can have the same composition as that of a plating solution that is generally used for producing semiconductor device and, more concretely, multi-layered wiring boards.

The electrolytic plating solution contains ions of a metal to be plated, reduces the metal ions through electrolysis and can cause the metal ions to precipitate in the form of a metal film on an electrically conductive metal material connected to a cathode. The metals to be contained in the electrolytic plating solution (hereinafter, also referred to as "plating metals") are not limited to the following examples but generally include copper, nickel, solder, rhodium and gold. These metals may be used either alone or in combination of two or more metals. More concretely, in the case of a copper plating solution, a plating bath can be broadly classified into an acidic bath and an alkaline bath. The plating solution for the acidic bath is a copper sulfate plating solution, and the plating solution for the alkaline bath includes a copper cyanide plating solution and a copper pyrophosphate plating solution. Numerous technical references describe the compositions of the electrolytic plating solution and the electroless plating solution and the plating methods. Therefore, a detailed explanation will be omitted.

The production of the printed wiring board by the use of the plating method of the invention can be carried out by basically employing those processes that are known to those skilled in the art and have generally been employed in the past, either as such or by arbitrarily changing them. Therefore, a detailed explanation of individual production processes for executing the invention will be omitted.

An example of a process for producing a printed wiring board in accordance with the present method will be hereinafter explained.

First, a double-face copper-clad laminate board is prepared as an object of plating. This double-face copper-clad laminate board includes an insulating resin substrate and a copper foil bonded to each surface of the resin substrate. Next, through-holes are bored in such a method as to penetrate through the laminate board. A drilling machine can be used for boring. Next, electroless copper plating is applied to the whole exposed surface of the laminate plate to form a thin electroless copper plating film. Subsequently, an electrolytic copper plating film is applied by using the electroless copper plating film as a cathode. Thereafter, unnecessary portions of the copper foil, the electroless copper plating film and the electrolytic copper plating film, that are formed over the surface of the laminate board in lamination, are etched away. As a result, there is obtained a conductor pattern that covers the inner wall of the through-holes and extends to the surface of the laminate board.

After the conductor pattern is formed as described above, formation of a wiring pattern and mounting of a semiconductor chip are carried out in a customary manner to give a printed wiring board having a desired structure. Though the example given above uses one double-face copper-clad laminate board, it is of course possible to use a single-face copper-clad laminate board or a printed wiring board having a multi-layered structure in place of the double-face copper-clad laminate board.

When the plating step described above is carried out, the invention controls the plating area, adjusts the areas of divided plating regions to avoid variance among the plating areas, and then produces the printed wiring board in a customary manner. Such a control method of the plating area will be explained with a control program of a plating area, a recording medium for controlling a plating area and a control apparatus of a plating area that are associated with the control method of the plating area, with reference to the accompanying drawings.

FIG. 1 shows an example of a printed wiring board as a typical example of the plating object according to the invention. As shown, the printed wiring board 10 includes minute and complicated wiring patterns and lands that are disposed at a high density. When producing such a printed wiring board, a conventional plating technology employs a method that optically and entirely scans only one of the surfaces of the substrate and collectively measures the overall plating area of the substrate. Therefore, this method can measure and adjust only variance of the plating areas between top and back surfaces of the substrate, and thus cannot cope with the recent remarkable progress of technologies. Further, the conventional method cannot flexibly cope with the production of a variety of kinds of products in limited quantities and with frequent changes of design, either. In contrast, this invention has found a novel measurement method of a plating area that divides a plated region into a large number of zones (cells) and measures the plating area of each zone. Unexpectedly, this invention provides remarkable operations and effects such that the method can correctly execute correction of production and design changes, can improve planarity of the substrate, can control the plating thickness, the etching amount and the thickness of an insulating layer, and can prevent insulation defects and connection defects.

When the plating area is controlled in accordance with the invention, the plated region of the printed wiring board is divided into a large number of zones, preferably a group of mesh-like zones having substantially the same area. This zone division step can be preferably carried out by combining a plurality of rows aligned in a transverse direction with a plurality of columns aligned in a longitudinal direction. This zone division step will be explained with reference to the printed wiring board 10 shown in FIG. 1. Rows (1, 2, . . . , 12) aligned in the transverse direction and columns (A, B, . . . , M) aligned in the longitudinal direction provide a group of mesh-like zones (A1, B1, . . . , F6, . . . , M12). Each zone to be measured generally has the same shape and the same size, but may have differences to a certain extent within an allowable range. As can be easily understood, when the printed wiring board is viewed under the divided state in accordance with the invention, the plating area generally has a large difference among the zones. Therefore, the invention that can easily control the plating area and has extremely large significance. In the illustrated example, one plating region is divided into 144 zones in total. However, the plating area may be divided into a greater or smaller number of zones, whenever necessary. In other words, the distribution of the zones to be measured may be coarse or dense in accordance with a distribution density of wiring patterns, etc. Furthermore, the zones to be measured may have shapes, such as triangular, other than square.

After the plated region is divided into a large number of zones as described above, the plating area of each zone is measured. The plating area can be measured either optically or electrically in a customary manner. If necessary, the plating area may be measured in accordance with the means described in the above-cited Japanese Unexamined Patent Publications.

After measurement of the plating area of each zone is complete, the measurement value of the plating area of each zone is compared to judge whether or not the plating area of each zone has variance. Here, the measurement value of the plating area can be electrically compared in accordance with a customary method.

When variance of the plating area is judged as existing in any of the zones in the variance judgment step of the plating area, the wiring patterns contained in that zone are checked again and a design change is made, whenever necessary. When the plating area is excessively great, for example, a design change, such as movement and reduction of the pattern, is made so as to reduce the plating area. When such a design change is made, a plating area that is balanced, as a whole, can be acquired.

After the design change is completed, the plating area measurement step and the variance judgment step described above are again repeated. When the problem of variance is judged as being eliminated, a production step of the printed wiring board is started as scheduled.

FIG. 2 is a flowchart showing a control method of a plating area in the production of the printed wiring board as a suitable example of the invention. The control method of the plating area shown in the drawing includes a step S1 of generating surface data having the same size as that of a plating area of a plating object (here, a maximum outside size of the printing wiring board); a step S2 of arranging surface data (surface data of a divided size) corresponding to a size of a zone to be divided in accordance with the invention inside the surface data generated in the step S1, by means of a separate picture layer; a step S3 of punching the surface data of the step S1 by the surface data of the divided size of the step S2; a step S4 of punching the data of the area of the plating object (data to be measured) by the data obtained in the step S3; a step S5 of calculating the plating area from the data of each zone obtained in the step S4; a step S6 of judging whether or not the numeric value of each plating area calculated by the step S5 has variance; and a step S7 of conducting a design change of a wiring pattern, etc, to eliminate variance when variance is judged as existing in the step S6 (see, No). When variance is not judged as existing in the step S6 (see, Yes), the production of the printed wiring board is started.

The steps S1 to S4 described above will be explained in sequence with reference to FIGS. 3A and 3B to FIG. 11.

Figure 3A:
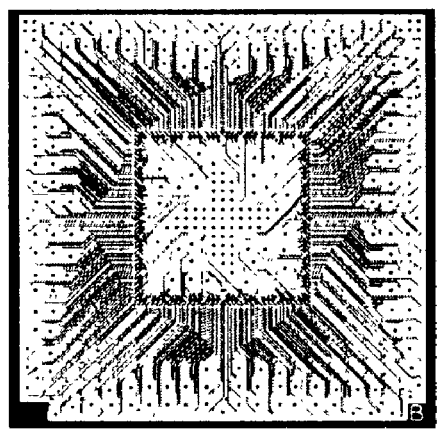
FIGS. 3A and 3B are plan views illustrating a surface data-creating step in the plating area control method according to the invention.
Figure 3B:
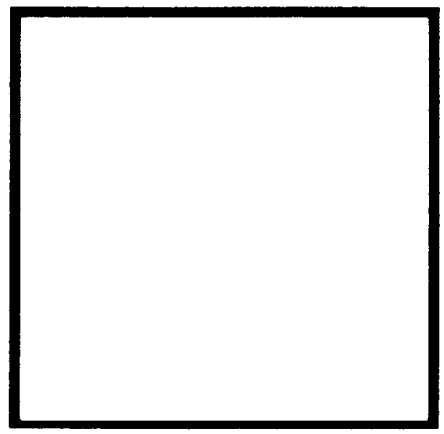

In the step S1, as shown in FIG. 3B, a surface data (hereinafter called "data A") having the same size as the maximum outside size of the printed wiring board 10 previously explained with reference to FIG. 1 and again shown in FIG. 3A is generated. The data A is a database that can erase all the plating area data of the printed wiring board to be measured, and is in a sense a masking data.

Figure 4A:
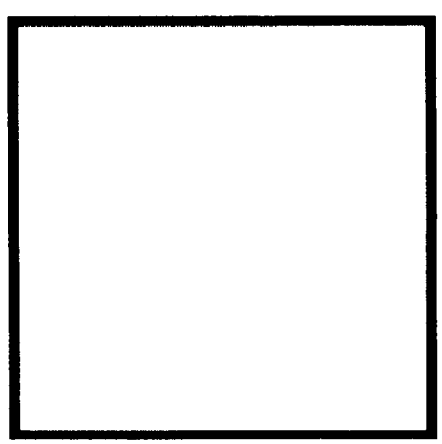
FIGS. 4A and 4B are plan views illustrating a divided surface data-creating step in the plating area control method according to the invention.
Figure 4B:
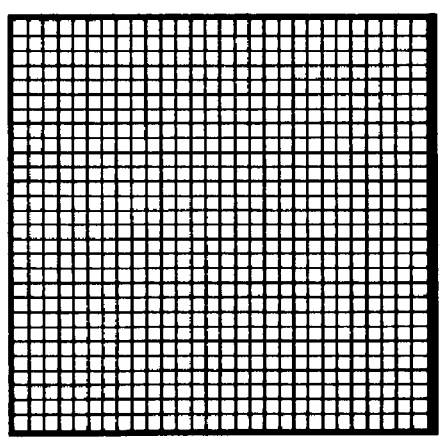

In the step S2, as shown in FIG. 4B, the surface data (surface data of the divided size: hereinafter called "data B") corresponding to the size of the zone to be divided in accordance with the invention is arranged as a separate picture layer inside the surface data (data A) generated in the preceding step S1 shown in FIG. 4A. In other words, the data B is for selectively erasing the data A in subsequent steps. The zone of the data B corresponds to the measured zone (A1, B1, F6, . . . ) of the printed wiring board shown in FIG. 1 but, it should be noted that in FIG. 4B, the total number of the zones is increased from 144 of FIG. 1 to 788 for convenience of explanation. Note also that FIG. 4B includes thick dividing lines to easily explain the presence of the adjacent zones, but in the adjacent zones, the zones contact with each other without any gap or dividing line.

Figure 5A:
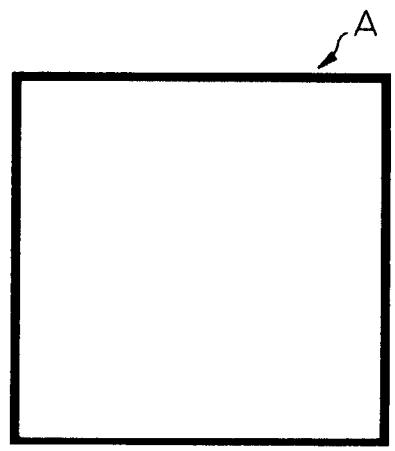
FIGS. 5A, 5B and 5C are plan views illustrating a surface data-punching step in the plating area control method according to the invention.
Figure 5B:
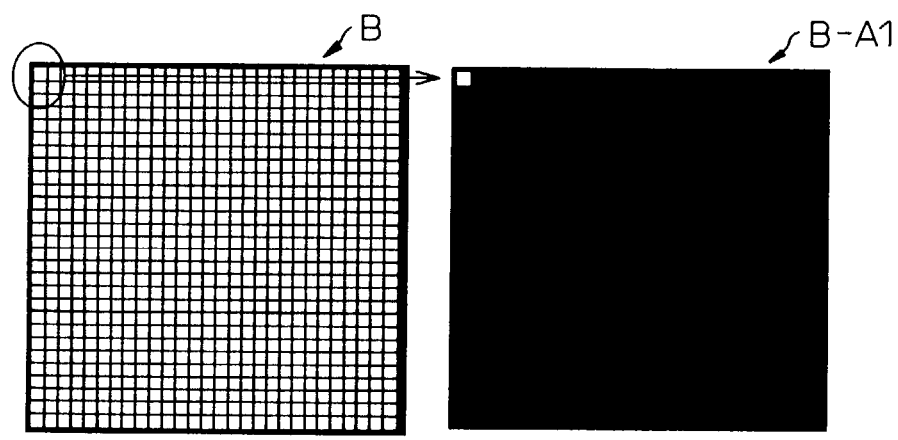
Figure 5C:
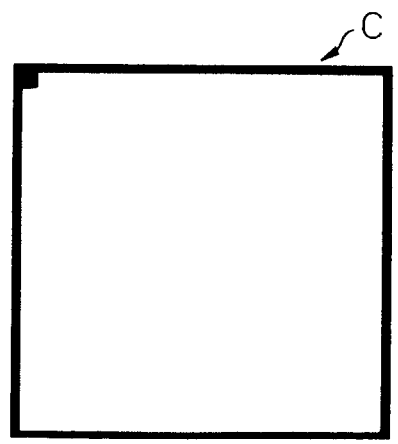

After the data A and the data B are created in the manner described above, in the step S3, the surface data of the measured zone A1 is punched out from the surface data (data A) of the step S1 shown in FIG. 5A by using one surface data (data B) of the step S2 shown in FIG. 5B, i.e. data B-A1, to create a clear state. In other words, there is obtained data C in which the surface data of the measured zone A1 is selectively erased from the data A as shown in FIG. 5C.

Figure 6A:
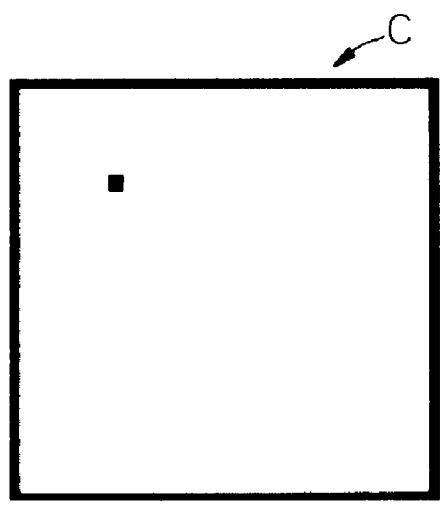
FIGS. 6A and 6B are plan views illustrating other results of the surface data-punching step.
Figure 6B:
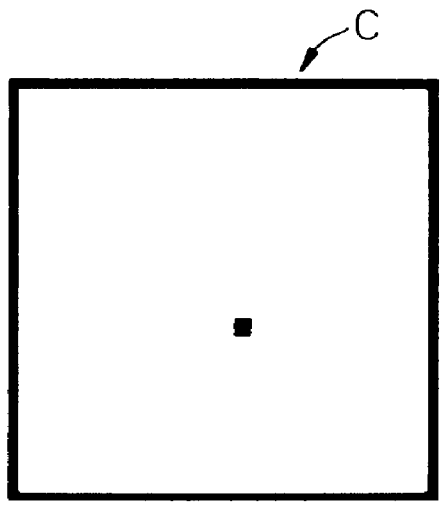
Figure 7A:
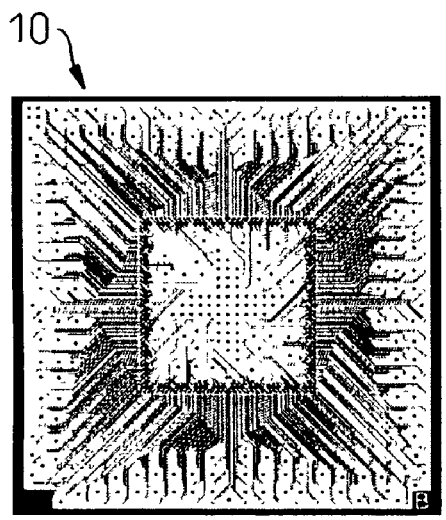
FIGS. 7A and 7B are plan views illustrating a measurement data-punching step in the plating area control method according to the invention.
Figure 7B:
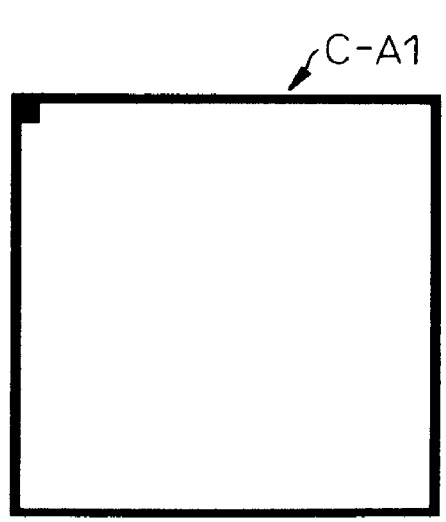

In the step S3, the data-punching step is executed for all the measured zones, and the number of data C corresponding to the number (788) of the surfaces of the data B can be obtained. FIGS. 6A and 6B show additional two examples of the resulting data C.

Figure 8:
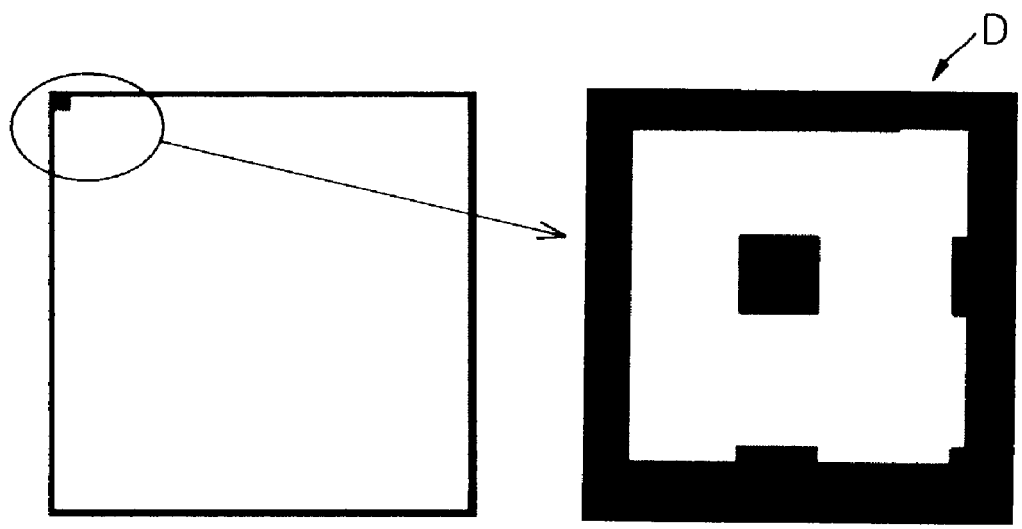
FIG. 8 is a plan view illustrating an example of measurement data obtained in the plating area control method according to the invention.

In the step S4, the data of the plating area of each measurement zone is punched out by using the data C obtained in the step S3 to create the clear state. For example, only the surface data of the measured zone A1 can be punched out from the data A shown in FIG. 7A by using one of the surface data in the step S3 shown in FIG. 7B, that is, data C-A1, to create the clear state. As a result, there is obtained data D in which only the measured zone A1 is cleared as shown in FIG. 8.

Figure 9:
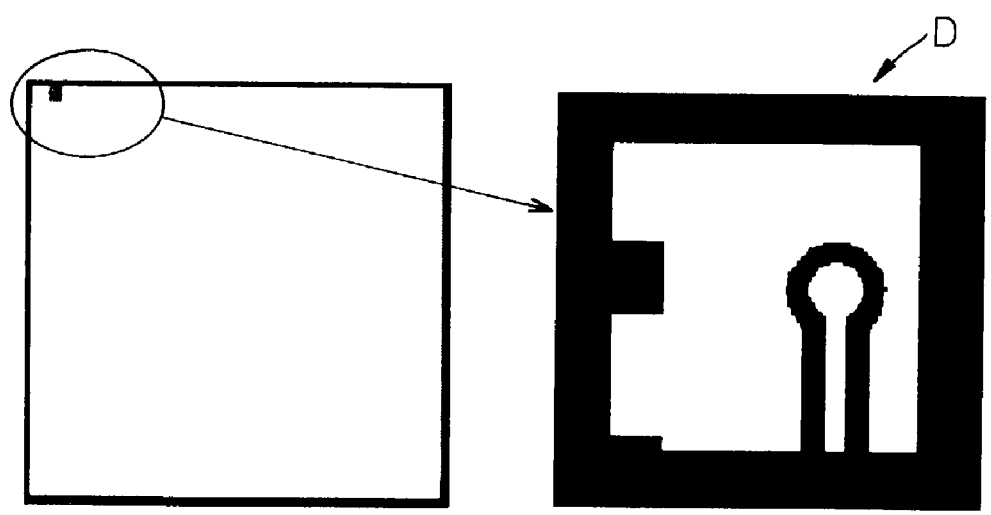
FIG. 9 is a plan view illustrating another example of measurement data obtained by the method according to the invention.
Figure 10:
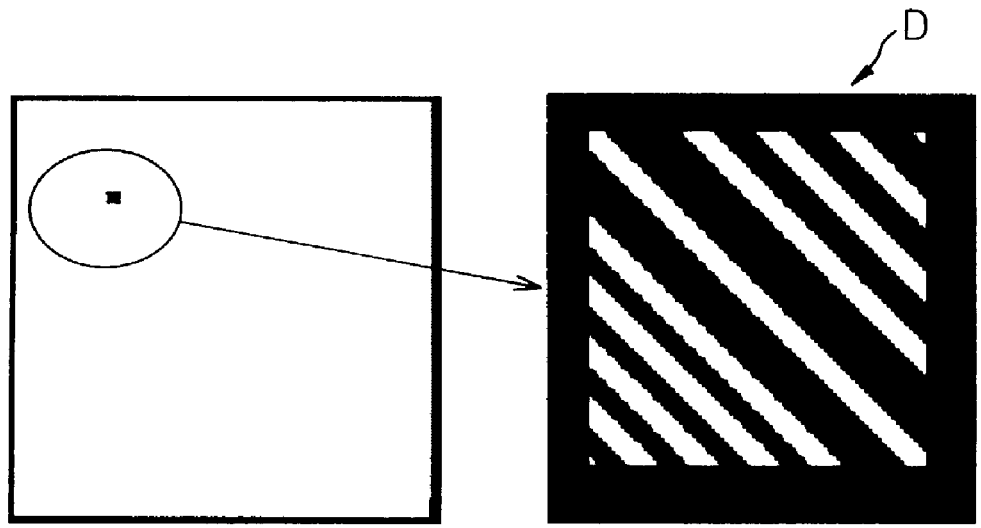
FIG. 10 is a plan view illustrating another example of measurement data obtained by the method according to the invention.
Figure 11:
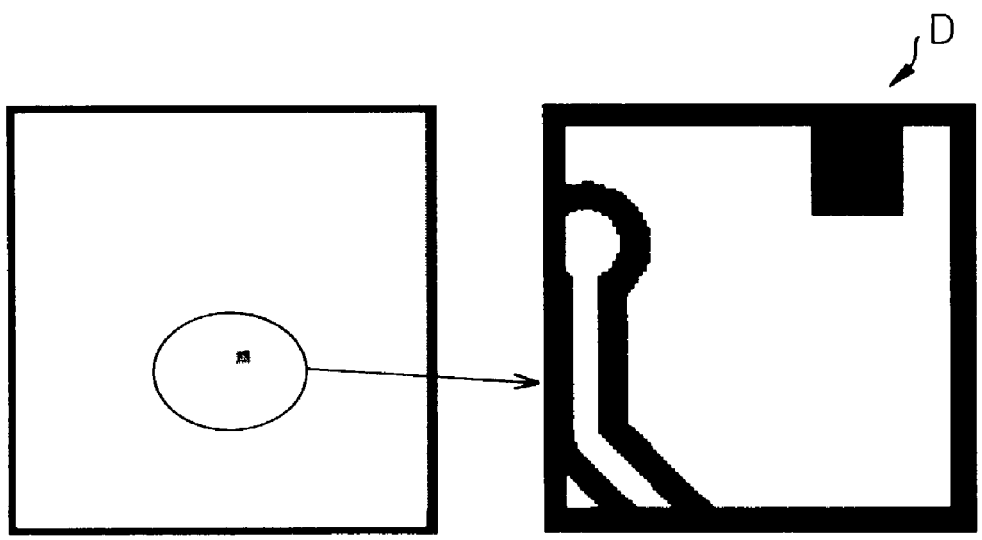
FIG. 11 is a plan view illustrating another example of measurement data obtained by the method according to the invention.

In the step S4, the data-punching step described above is executed for all the measured zones, and the number of data D corresponding to the number (788) of the surfaces of the data B can be obtained. FIGS. 9 to 11 show three additional examples of the resulting data D.

After the data D is obtained through a series of steps described above, in the step S5, the plating area is calculated from the data D of each zone obtained in the step S4.

After the calculation of the plating area, the step S6 judges whether or not any variance exists in the numeric value of each plating area so calculated. This judgment step can be advantageously executed in a customary manner by using a personal computer in combination with commercial software such as CAM and the like.

When the judgment result proves "variance exists in plating area" (No) in the step S6, a design change such as a pattern arrangement of the wiring patterns and the lands, the land width, etc, is made so as to eliminate large variance in the respective plating areas. A concrete example of this design change is as follows, though it is in no way restrictive. Namely, additional patterns are disposed in the regions having low numerical values (where the pattern density is low) and the patterns are skipped in the regions having high numeric values to reduce the pattern density. After the design change is made in the step S7, the flow again returns to the step S4 in order to judge whether or not this design change is appropriate, and the steps S5 and S6 are repeated.

When the judgment result is "No variance in plating area" (Yes) in the step S6, the execution of the step S7 is no longer necessary, and the production of the printed wiring board is started in a customary manner.

In addition to the control method of the plating method described above, the invention provides a program for controlling the plating area, an information recording medium storing such a control program, and a control apparatus of the plating area.

In the program for controlling the plating area, the program is used in combination with a computer when a pattern-providing plating film is formed at a predetermined film thickness on a substrate. The program causes the computer to execute a step of dividing a plated region of the substrate into a group of mesh-like zones each having substantially the same area; a step of measuring the plating area for each of the zones; a step of comparing the measurement values of the plating areas and judging whether or not the plating area has variance in each of the zones; and a step of conducting a design change for the patterns contained in any of the zones to eliminate the variance when the plating area is judged as having the variance in any of the zones in the variance judgment step.

The information recording medium according to the invention has stored therein the program for controlling the plating area described above.

The control apparatus of the plating area according to the invention is for preventing variance of the plating area when a pattern-providing plating film is formed at a predetermined thickness on a substrate. The apparatus comprises a plating region-division unit for dividing a region, to be plated, of the substrate into a group of mesh-like zones each having substantially the same area, an area measurement unit for measuring the plating area for each of the zones, a variance judgment unit for comparing the measurement values of the plating areas and judging whether or not variance exists in the plating area of each of the zones, and a pattern design-changing unit for making a design change of patterns contained in any of the zones to eliminate the variance when the plating area is judged as having the variance in any of the zones by the variance judgment unit.

Figure 12:
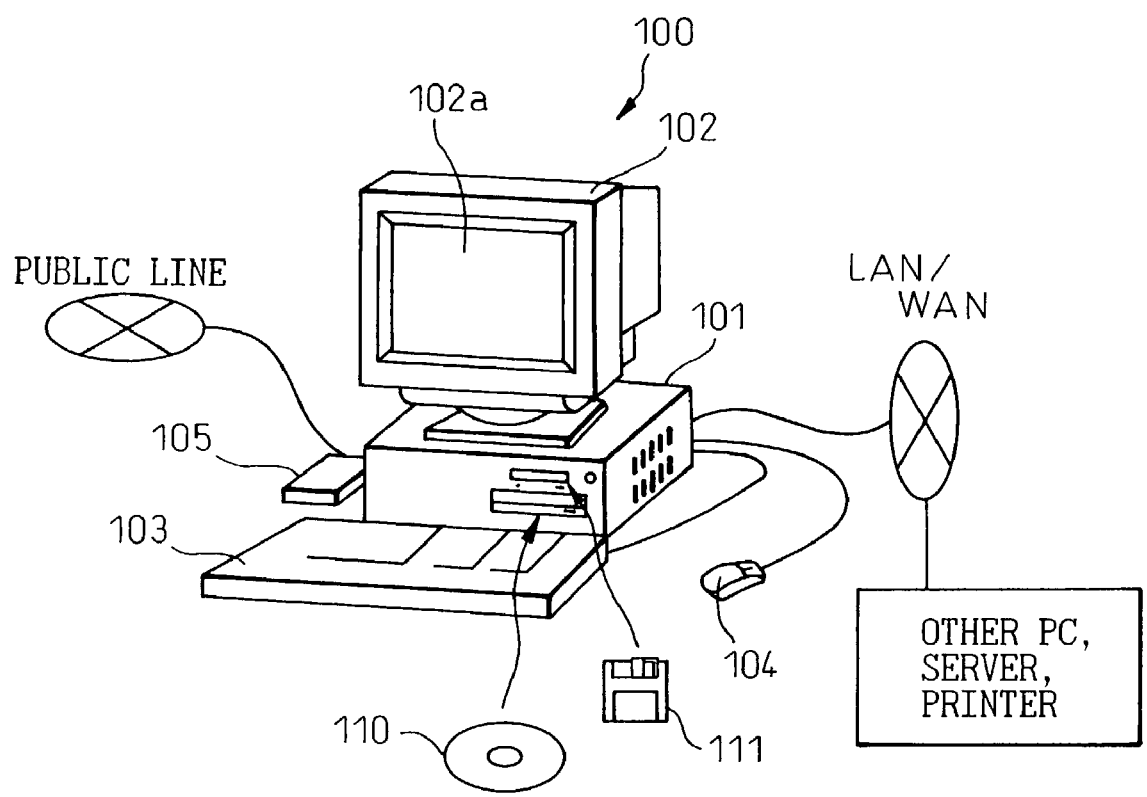
FIG. 12 is a perspective view illustrating a computer system, i.e., control apparatus, used in the practice of the invention, and a program and a recording medium that are used for the computer system.
Figure 13:
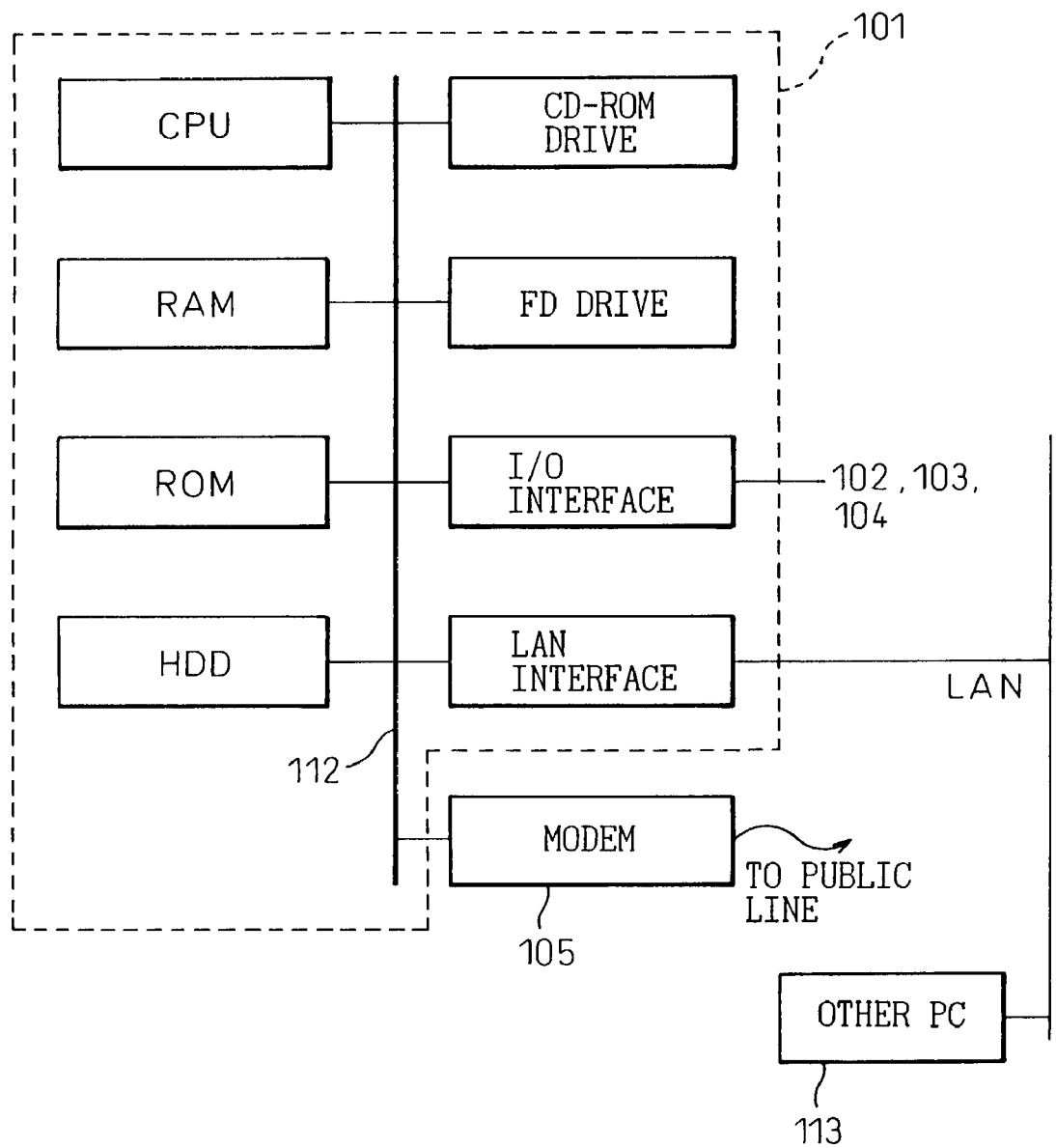
FIG. 13 is a flowchart showing the constitution of a monitor used in the computer system shown in FIG. 12.

FIGS. 12 and 13 are intended to concretely explain the inventions described above. FIG. 12 is a perspective view typically showing a method and an apparatus each for installing to a monitor the control program and its recording medium used in the plating area control method of the invention. FIG. 13 shows a constitution of the monitor shown in FIG. 12.

The monitor (hereinafter called a "computer system") shown in FIG. 12 includes a main unit 101, a display 102 for displaying information such as images on a display screen 102a in accordance with an instruction of the main unit 101, a keyboard 103 for inputting various kinds of information to the computer system 100, a pointing device (mouse) 104 for designating an arbitrary position on the display screen 102a of the display 102 and a modem 105 connected to a public line.

As shown in FIG. 13, the main unit 101 includes CPU, RAM, ROM, a hard disk drive (HDD), a CD-ROM drive and an FD drive, an I/O interface connected to the display 102, the keyboard 103 and the mouse 104, and a LAN interface for gaining access to the database connected through a communication line. These devices are connected to one another through a bus 112.

The program of the invention stored in the CD-ROM 110, the floppy™ disk (FD) 111, a portable recording medium (not shown) such as a DVD disk, an opto-magnetic disk or an IC card or the database connected through the communication line by using the modem 105 or the LAN interface is installed in, and executed by, the computer system 100. The program of the invention so installed is stored in the hard disk (HD) in the HDD and is executed by CPU by utilizing the RAM or the like.

Here, the recording medium storing the program of the invention includes not only the portable type recording media such as the CD-ROM 110, the FD 111, the DVD disk, the opto-magnetic disk, the IC card, etc, and a storage device provided to the inside/outside of the computer system 100 such as the hard disk drive, but also a database holding the program of the invention of the installation destination and connected through the communication line, such as another computer system (PC) connected to the computer system 100 through the LAN and indicated by reference numeral 113 or a database of a server and furthermore, a transfer medium on the communication line.

As explained above in detail, the invention can provide a plating method that can easily cope with production of various kinds of products in limited quantities and with frequent design changes, can eliminate variance of a plating area and, hence, variance of a plating film thickness, and can solve the problems such as planarity and warping of a substrate and film thickness control of an insulating film. Particularly, the invention can aid design of a printed wiring board, etc, in a data provision stage, can prevent insulation defects and contact defects in resulting products and can drastically improve a yield of the products.

Further, the invention provides a control method of a plating area, a control program of a plating area, a recording medium for controlling a plating area and a control apparatus of a plating area that are altogether useful for executing the plating method of the invention.

The invention claimed is:

1. A method for designing a plated pattern in a printed wiring board to prevent variance of plating areas when a pattern-providing plating film is formed at a predetermined thickness on a substrate, the method comprising:
    creating surface data having a same size as that of a plating area of the substrate to be plated;
    dividing the created surface data in a plurality of zones having a same area, each zone corresponding to surface data of a divided size, by means of a separate picture layer;
    punching the surface data having the same size as that of the plating area, by the surface data of the divided size;
    punching the surface data of the plating area of the substrate by the punched surface data obtained;
    measuring a plating area of each of the punched zones;
    comparing the measurement values of the plating areas and judging whether variance exists in the plating area in each punched zone; and
    checking wiring patterns of respective punched zones when variance is judged as existing and conducting a design change of patterns contained in the respective punched zones to eliminate the variance, thereby providing a balanced plating area as a whole in the printed wiring board.

2. The method of claim 1, wherein the zones comprise a group of mesh zones having substantially a same area.

3. The method of claim 1, wherein the plating area is measured optically or electrically.

4. The method of claim 1, wherein the design change is one of a movement or a reduction of the patterns.

5. The method of claim 1, further comprising measuring the plating area of each of the punched zones and comparing the measurement values of the plating areas and judging whether variance exists in the plating area of each punched zone after conducting the design change, repeatedly to thereby eliminate any existing variance.

* * * * *

UNITED STATES PATENT AND TRADEMARK OFFICE
CERTIFICATE OF CORRECTION

PATENT NO. : 7,226,634 B2  Page 1 of 1
APPLICATION NO. : 10/261939
DATED : June 5, 2007
INVENTOR(S) : Motoharu Nii It is certified that error appears in the above-identified patent and that said Letters Patent is hereby corrected as shown below:

On the Title Page, item (54) Column 1 (Title), Line 2, change "WRITING" to --WIRING--.

Column 1, Line 2, change "WRITING" to --WIRING--.

Signed and Sealed this

Twenty-ninth Day of July, 2008

JON W. DUDAS
*Director of the United States Patent and Trademark Office*